United States Patent [19]

Gibbons

[11] 4,243,433
[45] Jan. 6, 1981

[54] FORMING CONTROLLED INSET REGIONS BY ION IMPLANTATION AND LASER BOMBARDMENT

[76] Inventor: James F. Gibbons, 320 Tennyson Ave., Palo Alto, Calif. 94301

[21] Appl. No.: 870,432

[22] Filed: Jan. 18, 1978

[51] Int. Cl.² .............................................. H01L 21/26
[52] U.S. Cl. .................. 148/1.5; 219/121 L; 357/20; 357/34; 357/91
[58] Field of Search ...................... 148/1.5; 357/34, 20, 357/91; 219/121 L

[56] References Cited

U.S. PATENT DOCUMENTS 3,925,106  12/1975  Ku et al. ................................ 148/1.5
4,059,461  11/1977  Fan et al. .............................. 148/1.5

FOREIGN PATENT DOCUMENTS 2208271  8/1973  Fed. Rep. of Germany ............. 427/53

OTHER PUBLICATIONS

Kutukova et al., "Laser . . . Implanted Si" Sov. Phys. Semicond. 10 (1976) 265.
Shtyrkov et al., "Local Laser Annealing . . . Layers" Sov. Phys. Semicond. 9 (1976) 1309.
Antonenko et al., ". . . Impurity in Si . . . Laser Annealing" Sov. Phys. Semicond., 10 (1976) 81.
Bogatyrev et al., ". . . P-N Junctions . . . Laser Pulse . . . " Sov. Phys. Semicond. 10 (1976) 826.
Klimenko et al., ". . . Laser . . . Ion-Impln-Amorphized Si . . . " Sov. J. Quant. Electron., 5 (1976) 1289.
Kachurin et al., "Annealing . . . Laser . . . Pulses" Sov. Phys. Semicond., 9 (1976) 946.
Bhatia et al., "Isolation Process . . . " IBM-TDB, 19 (1977) 4171.
Poponiak et al., ". . . Implant Damage . . . Epi-Layer" IBM-TDB, 19 (1976) 2052.
Young et al., "Laser Annealing . . . Si" Appl. Phys. Letts. 32(3), 1978, 139.
Joshi et al., ". . . Impurity . . . S/C by Lasers" IBM-TDB, 11 (1968) 104.
Joshi et al., "Masking . . . for Laser Induced Diffusion" IBM-TDB, 13 (1970) 928.

Primary Examiner—L. Dewayne Rutledge
Assistant Examiner—Upendra Roy
Attorney, Agent, or Firm—Flehr, Hohbach, Test

[57] ABSTRACT

A semiconductor integrated circuit structure in which the inset regions are ion implanted and laser annealed to maintain substantially the dimensions of the implantation and the method of forming inset implanted regions having controlled dimensions.

8 Claims, 11 Drawing Figures

FORMING CONTROLLED INSET REGIONS BY ION IMPLANTATION AND LASER BOMBARDMENT

BACKGROUND OF THE INVENTION

This invention relates generally to a semiconductor integrated circuit structure and method of making the same and more particularly to such structures in which the implanted dimensions are maintained during annealing whereby to permit the formation of microgeometry transistors and semiconductor integrated circuits.

In the formation of integrated circuit structures it is desirable to reduce the size of the structure as much as possible. Reduction in size reduces the amount of surface area which is required to form integrated circuits whereby more junctions can be placed on a single semiconductor chip. Furthermore, the reduction in size permits operation at much higher frequencies.

Reference is made to FIGS. 1 and 2 to illustrate the general problem encountered with present day process. FIG. 1 is a schematic illustration of an idealized n-channel MOSFET which can be incorporated in an integrated circuit. This device includes a p-type substrate 11 having heavily doped n-type (n+) inset regions 12 and 13 forming source and drain contact wells. The wells are separated from each other by a distance $L_G$. The source and drain wells are taken to be identical and have a width Z and a length L. An oxide 14 and a thin metal layer 16 called the gate are fabricated over the region separating the source and drain and provide the control feature for the device. Metal source and drain contacts 17 and 18 overlie the oxide 14 and contact the wells 12 and 13. Briefly, an n-type conducting channel, shown in dotted line in FIG. 1, can be formed between the source and drain by applying a sufficiently large voltage between the gate and the source or the gate and the substrate. Current can then flow from the drain through the channel to the source. The presence or absence of a conducting channel provides the ON-OFF characteristic required for operation of the device in digital electronic circuits.

Referring to FIG. 2, it is seen that the minimum surface area of the active device is $A = Z(2L + L_G)$. The gate length $L_G$ is generally essentially equal to the length of the source and drain contact wells and the area A is then approximately equal to 3ZL.

From these geometrical considerations it is seen that, for a given value of Z, devices of small area require small values of L. Hence, the number of devices that can be placed on a given area of a silicon integrated circuit depends on how small L can be made.

The maximum operating frequency for the device depends of $L_G$ through the approximate formula $$f = \frac{\mu(V_{GS} - V_T)}{2\pi L_G^2} \quad (1)$$

where $\mu$ is the carrier mobility in the channel, $V_{GS}$ is the applied voltage between gate and source and $V_T$ is the voltage that must be applied to form the conducting channel. It will be apparent from Eq.(1) that small values of $L_G$ give large values of f. Hence, for both high packing density (small device area) and high speed of operation, L must be made as small as possible.

Currently values of L in the range of 1-2 $\mu$m represent practical limits of fabrication. The reason for this is illustrated in FIG. 3. FIG. 3 shows a single MOS device in which the source and drain contact wells 12 and 13 have been prepared by solid state diffusion. In this process, an oxide 14 is first grown on the semiconductor after which holes 19 are cut in the oxide by a process called photoengraving to expose the semiconductor. An n-type dopant such as phosphorus is then diffused through the holes 19 into the silicon by techniques well known to those skilled in the art. The diffusing phosphorus penetrates a depth D into the semiconductor and also moves a distance D laterally underneath the oxide. This lateral movement is critical since it cannot be permitted to proceed to the point where the source and drain contact wells touch each other. In fact, for reliable device operation, it is customary to limit the lateral penetration to $D \lesssim 0.1\ L_G$.

This lateral penetration phenomenon becomes critical when the dimensions of the device are reduced in an effort to increase the device packing density in an integrated circuit. For example, in order to introduce enough dopant into the semiconductor to form satisfactory n+ wells, it is necessary to perform the diffusion under conditions such that the diffusion depth D will be at least 0.5 $\mu$M. The lateral penetration will, therefore, also be 0.5 $\mu$m, and therefore the gate length must be on the order of 5 $\mu$m. A single device having Z = 100 $\mu$m will then occupy an area of approximately $3 \times 100\ \mu m \times 15\ \mu m$ or 4500 $(\mu m)^2$.

While this is satisfactory for many applications, photoengraving techniques that employ scanning electron beams or x-rays are capable of producing openings in the oxide that provide $L \lesssim 0.1\ \mu m$. Hence the basic device length can be reduced by more than an order of magnitude if a reliable procedure can be found for producing source and drain contact wells in closely-spaced regions.

The lateral penetration phenomenon just discussed makes solid state diffusion a poor candidate for fabrication of such small devices simply because the source and drain wells will diffuse into contact before sufficient doping has been introduced to make satisfactory wells.

A procedure that can be used to avoid part of this problem is to use ion implantation to introduce the dopant into the source and drain contact wells. Such a procedure is illustrated schematically in FIG. 4, where the semiconductor wafer 21 is exposed to a phosphorus ion beam 22. The photoresist 23 left on top of the oxide is one of many procedures known to those skilled in the art that can be used to prevent the beam from reaching the semiconductor or the oxide 24 where doping is to be avoided.

The implantation process provides essentially square contact wells 26. However, the ion beam also produces significant damage in the semiconductor, and this damage must be annealed before the doping characteristics of the implanted ions can be realized. The annealing can be carried out by placing the implanted sample in an annealing furnace. However, the implanted impurities diffuse during this annealing cycle, and hence the lateral penetration problem is once again made manifest, as illustrated in FIG. 5 by the region 27.

Referring to FIG. 6 which shows the impurity profile of an implanted species both before and after annealing, the profile prior to annealing is shown by the squares. The triangles show the profile after thermal annealing. It is seen that thermal annealing has produced a redistribution. In particular, the thermally annealed impurity distribution is now deeper than the as-implanted distribution. This increase in depth would be matched by a comparable lateral penetration if the dopant had been introduced through oxide windows into the silicon.

The use of laser energy to cause diffusion and annealing of implanted arsenic in silicon is taught by G. A. Kachurin and E. V. Nideav, *Soviet Phys. Semiconductors*, Vol. 11 No. 3 March 1977. They teach use of a ruby laser with energy density in the range of 90 Joules/cm$^2$ to cause substantial diffusion of implanted arsenic in silicon.

There is a need for a process and structure in which the extent of the inset regions is determined by the size of the openings or windows and the depth of ion implantation.

OBJECTS AND SUMMARY OF THE INVENTION

It is a general object of the present invention to provide a semiconductor integrated circuit structure having microgeometry and a method of making the same.

It is another object of the present invention to provide inset regions in a semiconductor body whose geometry and size is controlled primarily by ion implantation and a method of forming such inset regions.

It is a further object of the present invention to provide a method of forming a semiconductor integrated circuit structure having inset regions which are formed by ion implantation and annealed by employing laser energy.

It is a further object of the present invention to provide inset regions in a semiconductor by ion implantation through windows or openings and laser annealing said inset regions without causing diffusion from said regions.

The foregoing and other objects of the invention are achieved by the process of forming by ion implantation in a body of semiconductor material impurities in an inset region of predetermined area and depth and subsequently exposing said inset region to a laser beam to provide energy sufficient only to anneal the damage produced by implantation but not to cause significant diffusion outside said region.

DESCRIPTION OF PREFERRED EMBODIMENTS

In accordance with the present invention, the ion implanted inset regions are annealed and yet confined to their implant area and depth. As a consequence, the packing density is limited only by the ability to form small implanted regions. This, in turn, is limited only by the ability to control the masking during ion implantation. In the prior art, the ion implanted regions spread during the annealing process. However, I have discovered that the annealing procedure can be selected to avoid this problem. I have found that the diffusion can be limited by employing a controlled laser annealing process. In an appropriately designed laser annealing process, the laser can be either pulsed or scanned over the implanted area quickly so that the implantation-damaged material can be heated to its melting point and subsequently recrystallized in a time so short that no diffusive redistribution of the implanted impurity can occur. Hence the annealed impurity profile will be identical to the implanted profile. The combination of ion implantation and laser annealing are, therefore, capable of producing a contact well or inset region with no vertical or lateral impurity diffusion. Experimental verification of this process is provided in FIG. 6 where the laser annealed impurity profile shown by the circles is seen to be identical to the implanted impurity profile represented by the squares.

Figure 6:
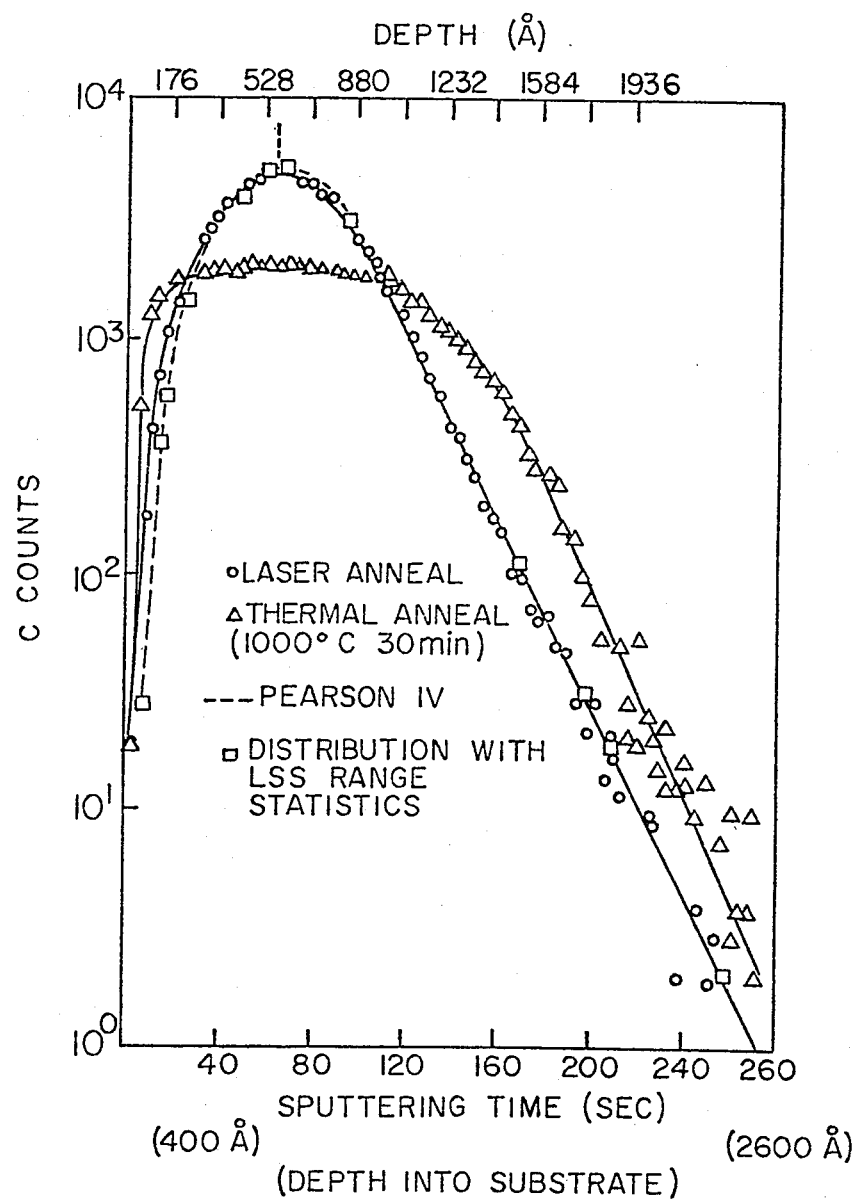
FIG. 6 shows the impurity profile of an ion implanted species and the extent of the impurities after thermal annealing and after annealing in accordance with the present invention.

Controlled conditions are, of course, required to obtain the desired diffusion-free annealing of ion implantation damage. These conditions place certain restrictions on both the amount of damage produced by the ion implantation and the laser energy that is supplied to the implanted layer for recrystallization. As an example of the implantation and laser annealing conditions that are suitable for diffusion-free annealing, the conditions used to obtain the profiles of FIG. 6 are described. Arsenic atoms were implanted at an energy of 100 keV into a room temperature silicon crystal to a dose of $5 \times 10^{14}$ atoms per cm$^2$.

As is described in the articles by J. F. Gibbons in *Proc. IEEE,* September 1968, entitled "Ion Implantation in Semiconductors: Part I;" and March 1972, "Ion Implantation in Semiconductors: Part II," the ion implantation of arsenic into silicon under the conditions specified in the previous paragraph will deposit arsenic atoms to a depth of approximately 0.24 μm and render the silicon crystal amorphous to a depth of approximately 0.3 μm. A laser pulse of sufficient energy is then capable of heating the amorphous layer to its melting temperature without raising the temperature of the underlying crystalline material to either its melting temperature or even a temperature at which significant impurity diffusion can occur. For example, a pulsed ruby laser with power output in the range of 25-50 Mw/cm$^2$ and duration in the range 30-50 ns will succeed in achieving the desired condition. The energy density supplied to the material in this case is 1-2 Joules/cm$^2$. Similarly, an argon laser beam having a diameter of approximately 25 μm and a power level of 7-8 watts can be scanned across the implanted area at a velocity of approximately 2 cm/sec to achieve the necessary conditions. However, if either the pulse width or the power level of the ruby laser are increased too far, the temperature of the underlying crystalline substrate can increase to a level which permits diffusion of the impurity into the underlying crystal.

It is preferable to drive the original crystal amorphous to a depth that exceeds the range of the implanted impurity atoms. This assures that significant diffusion of the impurity cannot occur. The crystal may be driven amorphous, as is well known to those skilled in the art, by a pre-implantation of $5 \times 10^{15}/cm^2$ silicon atoms into the silicon crystal at an energy of 280 keV. Such a silicon pre-implantation followed by the boron implantation will produce the conditions necessary for the preferable substantially diffusion-free annealing; i.e., an amorphous layer that contains essentially all of the implanted impurity atoms and a laser energy density that is selected to be sufficiently low to melt the amorphous material without raising the temperature of the underlying crystal to a point where melting or significant diffusion can occur. This combination of processes and conditions provides the process that is necessary to take advantage of the small scale openings that can be produced using electron beam or x-ray photolithography.

Figure 1:
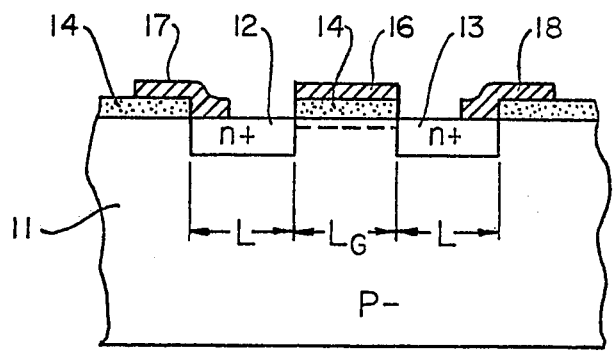
FIG. 1 is a sectional side view of an idealized MOSFET device.
Figure 2:
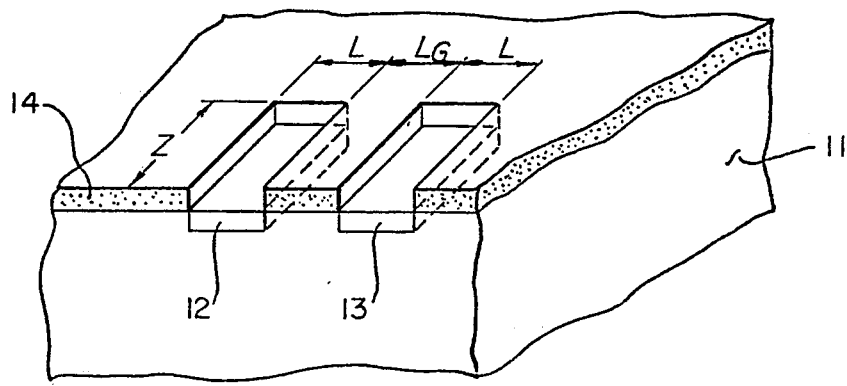
FIG. 2 is a perspective view of the MOSFET device of FIG. 1 without the metal electrodes.
Figure 3:
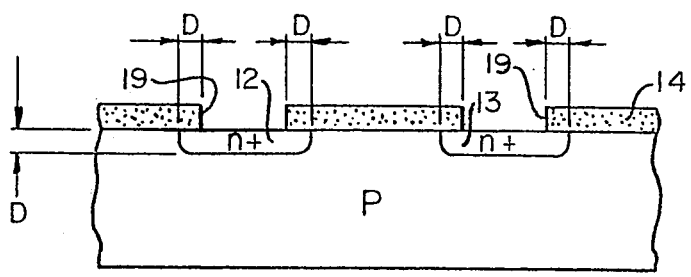
FIG. 3 is a sectional side view of a prior art MOSFET device which has been formed by diffusion through openings formed in an oxide mask.
Figure 4:
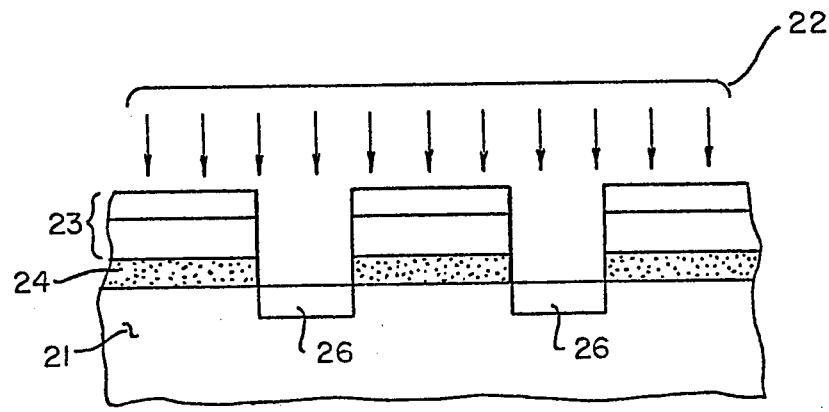
FIG. 4 is a sectional side view showing ion implantation of inset regions in a semiconductor body.
Figure 5:
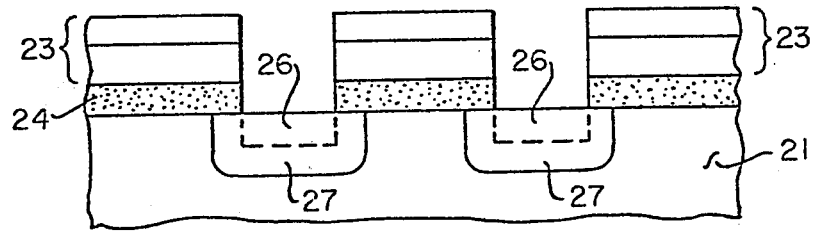
FIG. 5 is a sectional view of the device of FIG. 4 after it has been thermally annealed.
Figure 7:
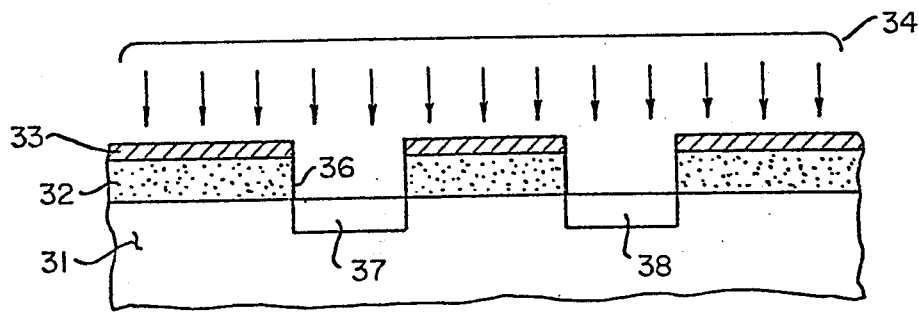
FIGS. 7 and 8 are sectional views showing the steps in forming ion implanted inset regions in accordance with the present invention.
Figure 8:
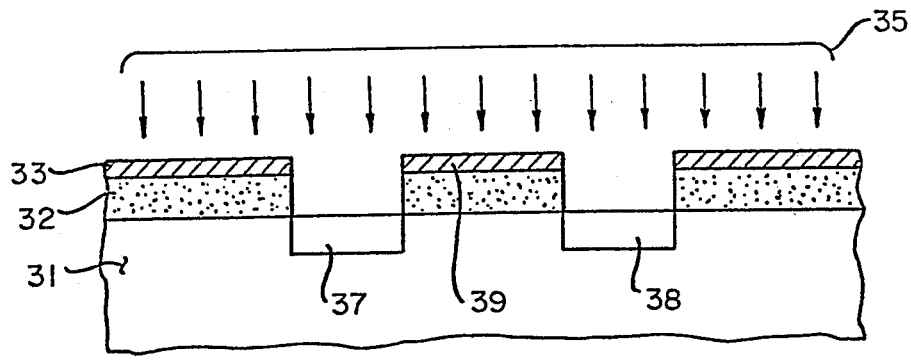

Application of these concepts to the fabrication of source and drain wells for a MOSFET is shown in FIGS. 7 and 8. FIG. 7 shows a semiconductor substrate 31 with a combined oxide 32 and metal 33 mask that may be used to avoid implantation of dopant, indicated by arrows 34, into the semiconductor substrate 31 except in the desired areas underlying openings 36. Source and drain doping wells or inset regions 37 and 38 may be obtained by implanting arsenic atoms to a dose of $5 \times 10^{14}/cm^2$ at an energy of 100 keV. The oxide thickness may be in the range of 400–4000 Å and the metal layer may be aluminum with a thickness of approximately 5000 Å.

A laser pulse 35 of energy density 1-2 Joules/cm$^2$ may then be flashed over the implanted areas 37 and 38, FIG. 8, annealing said regions without permitting significant diffusion of the implanted arsenic atoms. The metal mask 33 serves to reflect the laser beam in those areas where annealing is not desired. Subsequent patterning of the metal can be advantageously performed to fabricate the gate electrode 39.

Figure 9:
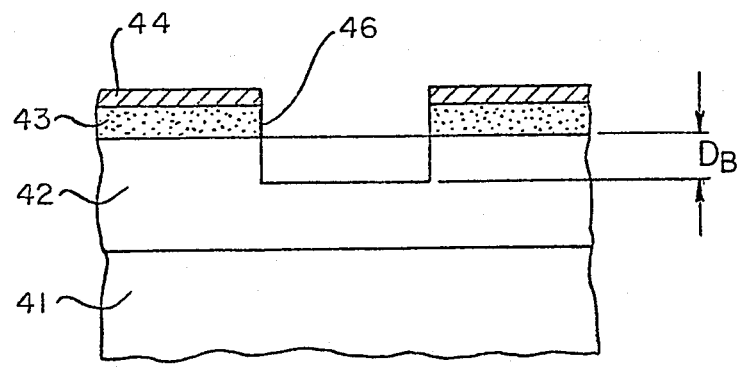
FIGS. 9, 10 and 11 show the fabrication of a bipolar transistor in accordance with the present invention.
Figure 10:
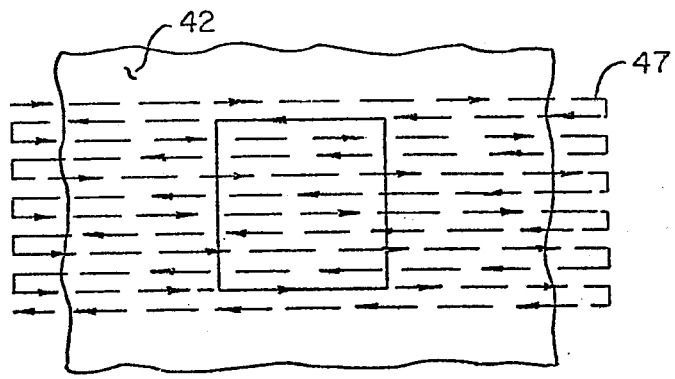
Figure 11:
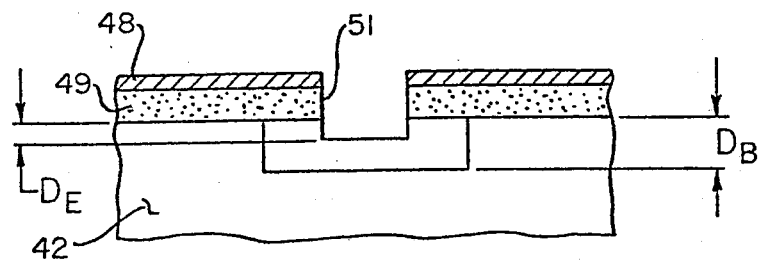

It will also be apparent to one skilled in the art that very small geometry bipolar transistor structures can be fabricated in accordance with the present invention. FIGS. 9, 10 and 11 illustrate the use of the process to form a bipolar transistor of very small base width. A bipolar device may be constructed by employing an n+-type substrate 41 on which is grown an n-type epitaxial layer 42. The substrate 41 serves as the collector. A thin layer of oxide 43 and a thin metal layer 44 are then formed on the surface and a window 46 is opened to expose the epitaxial surface 42 using techniques well known to those skilled in the art. Silicon is then implanted to a dose of $5 \times 10^{15}$ atoms/cm$^2$ at an energy of 280 keV to drive the crystal amorphous to a depth of approximately 5000 Å. Boron (or other p-type impurity) is then implanted to a depth $D_B$ and less than 5000 Å, and the structure is then exposed to a laser annealing cycle in accordance with the foregoing. The metal layer serves to reflect the laser beam in those regions where it is not desired to heat the underlying silicon. The laser annealing can be performed by scanning a continuous-beam laser of sufficient power across the sample as illustrated by the lines 47 in FIG. 10, or by exposing the entire sample to a laser pulse of appropriate energy.

When this step is completed, the metal/oxide masking layers can be removed and a new metal/oxide masking layer 48, 49 can be prepared with a window 51 that lies inside the previous window. Arsenic or other n-type dopant can then be implanted under conditions similar to those described above to a depth $D_E$ and laser annealed under conditions that will not produce significant diffusion into the previously prepared p-type layer. Ohmic contacts can then be made to the structure by procedures well known to those skilled in the art.

This sequence of processes thus produces a bipolar transistor with a base width ($D_B$-$D_E$) that can be controlled by controlling the energy of the ions that are used to introduce base and emitter doping. Furthermore, as described in the Proc. IEEE above, the impurity profiles obtainable with ion implantation provides a technique for obtaining implanted base widths ($D_B$-$D_E$) that are on the order of 1000 Å or less, so the addition of a diffusion-free laser annealing, which preserves the implanted impurity profile during annealing, provides a process for producing thinner base layers and, therefore, higher frequency devices than can be produced if thermal annealing or solid state diffusion are used to fabricate the structure.

From these examples it will be clear that the combination of ion implantation and laser annealing provides a process for controlling both the vertical and lateral dimensions of the doping profile. The process described is applicable to GaAs and other semiconductors in addition to silicon.

What is claimed is:

1. The method of forming an inset region of predetermined conductivity type having predetermined area and depth in a body of semiconductor material including the steps of forming an amorphous region of predetermined area and depth in said semiconductor body, forming by ion implantation of impurities a damaged region of area and depth less than said predetermined area and depth, and thereafter striking said damaged region with a laser beam having sufficient energy to anneal the damage produced by the implantation but not having enough energy to cause significant diffusion of impurities out of said damaged region.

2. A semiconductor structure formed by the method of claim 1.

3. The method of forming a semiconductor structure having inset regions of predetermined conductivity type and predetermined area and depth comprising the steps of forming a mask having openings of said predetermined area on one surface of the device, forming by ion implantation through said openings an amorphous region of predetermined area and depth, implanting by ion implantation through said openings to a depth less than said depth impurities characterizing said conductivity type, and striking said region through said mask openings with a laser beam having sufficient energy to anneal the damage produced by the implantation but not sufficient to cause significant diffusion of impurities from said amorphous region.

4. A semiconductor structure formed by the method of claim 3.

5. The method of forming a semiconductor structure having inset regions of predetermined conductivity type and predetermined area and depth comprising the steps of forming a mask having openings of said predetermined area on one surface of the device, forming by ion implantation through said openings an amorphous region of predetermined area and depth, implanting by ion implantation through said openings to a depth less than said depth impurities characterizing said conductivity type, striking said implanted region with a laser beam having sufficient energy to anneal the damage produced by the implantation but not sufficient to cause significant diffusion of impurities from said amorphous region, forming a second mask having second openings which are smaller than said area, said openings overlying said region, implanting by ion implantation through said second openings to a depth less than the depth of the ion implanted region impurities characterizing an opposite conductivity type to form a second inset region and striking said second inset region with a laser beam having sufficient energy to anneal the damage produced by the implantation but not sufficient to cause significant diffusion of impurities from said second implanted region into said first implanted region.

6. A semiconductor structure formed by the method of claim 5.

7. In the method of forming a semiconductor structure having annealed inset regions of predetermined conductivity type and predetermined area and depth wherein a mask having openings of said predetermined area is formed on one surface of the device and ions are implanted through said openings to a predetermined depth to form said inset region containing impurities characterizing said conductivity type, the steps of leaving the mask intact and striking said region through the openings in said mask with a laser beam having sufficient energy to anneal the damage produced by the implantation but not sufficient to cause significant diffusion of impurities from said region into said structure whereby the ion implanted inset region maintains its area and depth.

8. In the method of forming a semiconductor structure having annealed inset regions of predetermined conductivity type and predetermined area and depth one inset into the other wherein sequential masks having openings of said predetermined areas are formed on one surface of the device and ions are sequentially implanted through said openings to predetermined depths to form one region inset into said structure and a second region inset into said one region, said regions containing impurities characterizing different conductivity types, the steps of striking each of said regions with a laser beam having sufficient energy to anneal the damage produced by the implantation but not sufficient to cause significant diffusion of impurities from said region as each implanted inset region is formed to anneal the damage produced by the implantation but not sufficient to cause significant diffusion of impurities from said one region into the substrate or from said second region into said first region.

* * * * *

UNITED STATES PATENT AND TRADEMARK OFFICE
CERTIFICATE OF CORRECTION

PATENT NO. : 4,243,433

DATED : January 6, 1981

INVENTOR(S) : James F. Gibbons

It is certified that error appears in the above-identified patent and that said Letters Patent is hereby corrected as shown below:

At column 1, line 4, insert --This invention was made with Government support under Contract No. DMR-76-18000 awarded by the National Science Foundation. The Government has certain rights in this invention.--

Signed and Sealed this

Seventh Day of March, 1995

*Attest:*

BRUCE LEHMAN

*Attesting Officer*   *Commissioner of Patents and Trademarks*